(12) United States Patent
Pumyea

(10) Patent No.: US 7,993,940 B2
(45) Date of Patent: Aug. 9, 2011

(54) COMPONENT ATTACH METHODS AND RELATED DEVICE STRUCTURES

(75) Inventor: Warren P. Pumyea, Gardner, MA (US)

(73) Assignee: Luminus Devices, Inc., Billerica, MA (US)

( * ) Notice: Subject to any disclaimer, the term of this patent is extended or adjusted under 35 U.S.C. 154(b) by 375 days.

(21) Appl. No.: 11/950,934

(22) Filed: Dec. 5, 2007

(65) Prior Publication Data

US 2009/0146172 A1    Jun. 11, 2009

(51) Int. Cl.
*H01L 21/00* (2006.01)
(52) U.S. Cl. .......................................... 438/15; 257/723
(58) Field of Classification Search .................. None
See application file for complete search history.

(56) References Cited

U.S. PATENT DOCUMENTS

| | | | | |
|---|---|---|---|---|
| 4,342,090 A | * | 7/1982 | Caccoma et al. | 716/8 |
| 4,940,181 A | * | 7/1990 | Juskey et al. | 228/180.21 |
| 5,341,564 A | * | 8/1994 | Akhavain et al. | 29/832 |
| 5,371,328 A | * | 12/1994 | Gutierrez et al. | 174/261 |
| 5,432,318 A | * | 7/1995 | Minahan | 219/385 |
| 6,647,050 B2 | | 11/2003 | Yuen et al. | |
| 7,098,588 B2 | | 8/2006 | Jager et al. | |
| 7,211,833 B2 | | 5/2007 | Slater, Jr. et al. | |
| 2002/0195935 A1 | | 12/2002 | Jager et al. | |
| 2003/0053510 A1 | | 3/2003 | Yuen et al. | |
| 2004/0118599 A1 | | 6/2004 | Chason et al. | |
| 2005/0194603 A1 | | 9/2005 | Slater, Jr. et al. | |
| 2006/0289203 A1 | * | 12/2006 | Oda | 174/264 |
| 2007/0085082 A1 | | 4/2007 | Erchak et al. | |
| 2007/0161137 A1 | | 7/2007 | Slater, Jr. et al. | |
| 2007/0228109 A1 | * | 10/2007 | Smith et al. | 228/176 |

* cited by examiner

*Primary Examiner* — Jarrett J Stark
*Assistant Examiner* — Nicholas Tobergte
(74) *Attorney, Agent, or Firm* — Wolf, Greenfield & Sacks, P.C.

(57) ABSTRACT

A method, and associated apparatus, for attaching a component (e.g., an electronic and/or optoelectronic component) is provided which can facilitate low-voiding of an attachment layer. The method includes disposing an attachment material layer over a surface, providing the component having a backside surface, disposing a portion of the backside surface of the component over a first portion of the attachment material layer such that a substantial portion of the backside surface of the component is not disposed over the attachment material layer, and moving the component such that the component is attached to at least a portion of the attachment material layer that is substantially larger than the first portion of the attachment material layer. The attachment material can include a solder. A light-emitting device is also described that comprises a component including a light-emitting die, wherein the component is supported by a substrate, and wherein the light-emitting die comprises a light emission surface and a backside surface disposed opposite the light emission surface. The light emission surface of the light-emitting die has an area greater than or equal to 1 mm$^2$ and an attachment material layer is disposed between the backside surface of the light-emitting die and the substrate, wherein the attachment material layer has voiding of less than 5% of an area of the backside surface.

19 Claims, 15 Drawing Sheets

COMPONENT ATTACH METHODS AND RELATED DEVICE STRUCTURES

FIELD OF THE INVENTION

The present embodiments are drawn generally towards component attachment methods and related device structures, and to apparatus that can implement the methods. Specifically, the methods and structures of at least some of the embodiments relate to the attachment of components that may comprise a light-emitting die.

BACKGROUND

Electronic and optoelectronic components are typically attached to substrates, such as circuit boards or package substrates. Various attachment materials can be used to accomplish the attachment of such components to the surface of the circuit board or package substrate. In this manner, various components can be combined on a common platform. Also, the substrate to which components are attached may include electrical metal traces and/or optical waveguides that can provide for connection between the components or an external connector.

SUMMARY

Component attach methods, component attach apparatus, and component attached devices are provided.

In one aspect, a method of attaching a component is provided. The method comprises disposing an attachment material layer over a surface, providing the component having a backside surface, disposing a portion of the backside surface of the component over a first portion of the attachment material layer such that a substantial portion of the backside surface of the component is not disposed over the attachment material layer, and moving the component relative the surface such that the component is attached to at least a portion of the attachment material layer that is substantially larger than the first portion of the attachment material layer.

In one aspect, a component attach apparatus is configured to perform a method to attach a component to a surface, wherein the method comprises disposing a portion of a backside surface of the component over a first portion of an attachment material layer such that a substantial portion of the backside surface of the component is not disposed over the attachment material layer, and moving the component relative the surface such that the component is attached to at least a portion of the attachment material layer that is substantially larger than the first portion of the attachment material layer.

In one aspect, a light-emitting device comprises a substrate, a component comprising a light-emitting die, wherein the component is supported by the substrate, wherein the light-emitting die comprises a light emission surface and a backside surface disposed opposite the light emission surface, and wherein the light emission surface of the light-emitting die has an area greater than or equal to 1 mm$^2$, and an attachment material layer disposed between the backside surface of the light-emitting die and the substrate, wherein the attachment material layer has voiding of less than 5% of an area of the backside surface.

In one aspect, a method of attaching a component is provided. The method comprises providing a surface comprising an attachment area comprising a solderable surface and a recessed staging area disposed adjacent to the attachment area, disposing a solder layer over the attachment area of the surface, disposing a component comprising a backside surface that is substantially disposed over the recessed staging area, and moving the component such that the component is substantially disposed over the attachment area.

In one aspect, a light-emitting device comprises a substrate comprising an attachment area comprising a solderable surface, and a recessed staging area disposed adjacent to the attachment area, a light-emitting die comprising a light emission surface and a backside surface disposed opposite the light emission surface, wherein the light-emitting die is supported by the substrate, and a solder layer disposed between the backside surface of the light-emitting die and the solderable surface of the substrate.

Other aspects, embodiments and features of the invention will become apparent from the following detailed description of the invention when considered in conjunction with the accompanying figures. The accompanying figures are schematic and are not intended to be drawn to scale. In the figures, each identical or substantially similar component that is illustrated in various figures is represented by a single numeral or notation.

For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

At least some embodiments presented herein relate to component attachment methods, apparatus, and related structures. In some embodiments, optoelectronic, electronic, photonic, RF, and/or MEMs components can be attached to a surface, such as may be provided by a package substrate, a circuit board, a heat management system, or any other part having a suitable attachment surface. The components attached can include optoelectronic, photonic, RF, and/or MEMs components, for example semiconductor dies.

At least some methods, and associated apparatus that can implement the methods, presented herein can facilitate the formation of an attachment material layer having low voiding. Attachment layers having low voiding can facilitate the efficient transfer of heat generated by the component (e.g., electronic, optoelectronic component) to an attachment substrate. Low voiding of the attachment material layer can thus enable high power operation of the component due to efficient heat transfer to the attachment substrate. For example, one such component can include one or more light-emitting devices (e.g., LEDs and/or laser diodes), for example one or more high power LEDs that, in some embodiments, can include light-emitting dies having a large light emission area (e.g., greater than about 1 mm$^2$ greater than about 3 mm$^2$, greater than about 5 mm$^2$, greater than about 10 mm$^2$). Such LEDs can be driven by high currents (e.g., greater than about 3 Amps, greater than about 5 Amps, greater than about 10 Amps) and hence can generate large amounts of heat.

An embodiment of a component attachment method is illustrated in FIGS. 1-6. The method may include disposing an attachment material layer over a surface, providing the component having a backside surface, disposing a portion of the backside surface of the component over (e.g., in contact with) a first portion of the attachment material layer such that a substantial portion of the backside surface of the component is not disposed over the attachment material layer, and moving the component such that the component is attached to at least a portion of the attachment material layer that is substantially larger than the first portion of the attachment material layer.

Figure 1A:
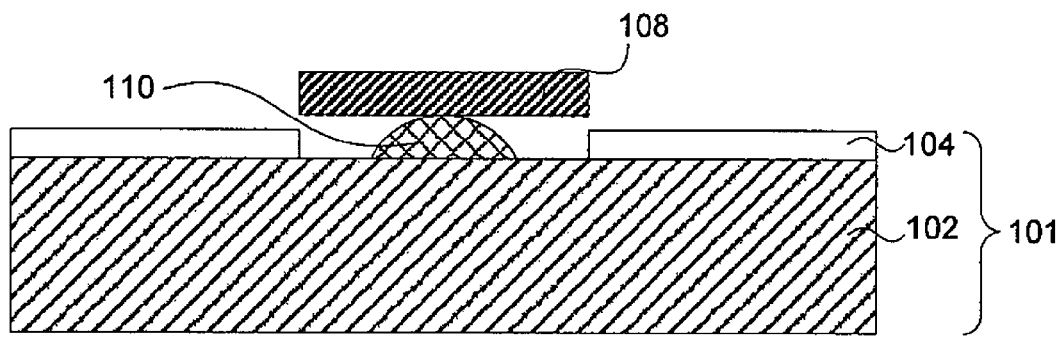
FIGS. 1A and 1B are side cross-section and top views, respectively, of a surface to which a component can be attached to, in accordance with one embodiment.
Figure 1B:
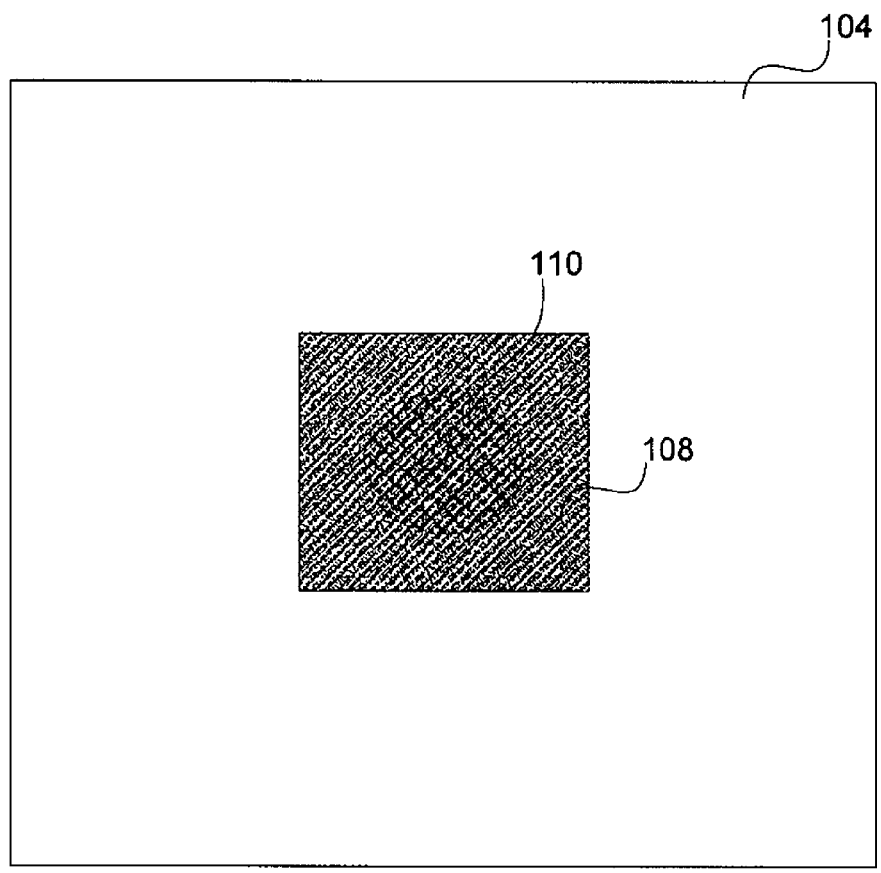

FIGS. 1A and 1B illustrate side cross-section and top views, respectively, of a surface to which the component can be attached. The surface can be part of a package or board that supports the component. Alternatively or additionally, the surface may be part of a heat management component or system, for example a heat pipe, a vapor plate, and/or heat sink. FIG. 1A illustrates a substrate 101 to which the component can be attached. The substrate can be part of a package, a board (e.g., a circuit board), a thermal management component or system, or any other suitable structure. Substrate 101 can include a substrate core 102 and an overlayer 104. Substrate core 102 may comprise an electrically conducting material. The electrically conductive material may include one or more metals (e.g., copper, aluminum, gold, silver, and/or alloys thereof). Substrate core 102 may include an exposed surface to which the attachment material can bond with (e.g., a solderable surface).

In some embodiments, overlayer 104 may comprise an electrically insulating material. The electrically insulating material may include one or more dielectric materials. Examples of electrically insulating materials may include ceramic, epoxy, polyimide, or other filled or unfilled polymers commonly used in printed circuit board manufacturing. Overlayer 104 may include multiple layers of electrically insulating material that can be layers at least partially or completely over each other. In some embodiments, electrically conductive traces (e.g., metal layer traces, such a copper traces) can be disposed between electrically insulating layers of overlayer 104 (not shown). Overlayer 104 may have a surface to which the attachment material cannot bond (e.g., a non-solderable surface). In other embodiments, overlayer 104 may comprise an electrically conducting material.

Overlayer 104 may cover a portion of substrate core 102 so to allow of the exposure of a portion of the substrate core 102. Overlayer 104 can form a pattern having one or more holes that expose areas of substrate core 102 to which components may be attached. The exposed portion of substrate core 102 may be a solderable surface on which the component can be attached. Overlayer 104 may include a non-solderable surface.

The attachment method can include providing an attachment material layer over the exposed portion of substrate core 102. In some embodiments, the attachment material comprises a solder, such as a metal solder. Solder examples may include a metal or metal alloy, such as alloys including tin, antimony, zinc, indium, bismuth, lead, silver, and/or copper (e.g., SnCu$_{0.7}$, SnZn$_9$, SnZn$_8$Bi$_3$, SnSb$_5$, SnAg$_{2.5}$Cu$_{0.8}$Sb$_{0.5}$, SnIn$_{8.0}$Ag$_{3.5}$Bi$_{0.5}$, SnBi$_{57}$Ag$_1$, SnBi$_{58}$, SnIn$_{52}$, SnAg$_{3.0}$Cu$_{0.5}$, SnAg$_{3.5}$Cu$_{0.7}$, SnAg$_{3.5}$Cu$_{0.9}$, SnAg$_{3.8}$Cu$_{0.7}$, SnAg$_{3.8}$Cu$_{0.7}$Sb$_{0.25}$, SnAg$_{3.9}$Cu$_{0.6}$). Although some descriptions presented herein are described for situations where the attachment material comprises solder, some embodiments may involve the use of other attachment materials such as, metal-filled epoxies or thermally conductive adhesives.

In some embodiments where the attachment material includes solder, a solder layer may be formed using a solder paste and/or preformed solder. In one embodiment a preformed solder has a substantially similar area as a component to be attached and/or as the solderable area of the attachment surface (e.g., an area of the exposed substrate core 102). The use of a preformed solder can facilitate the formation of a solder layer distributed evenly over substantially all of the backside of the component and/or over all of the solderable area of the attachment surface (e.g., an area of the exposed substrate core 102).

The method can include disposing a flux material 110 on the surface to which the component is to be attached (e.g., exposed substrate core 102), and shown in FIG. 1A. The flux material 110 can include any suitable solder flux (e.g., water soluble fluxes such as TACflux-025 made by Indium Corp., no-clean fluxes such as TACflux-023 made by Indium Corp. or Kester-951 made by Kester Corp.). The method can include disposing a preformed solder 108 over the flux material 110, as shown in FIG. 1A. Alternatively, or additionally, disposing an attachment material layer over the surface can comprise disposing a solder paste over the solderable surface.

Figure 2A:
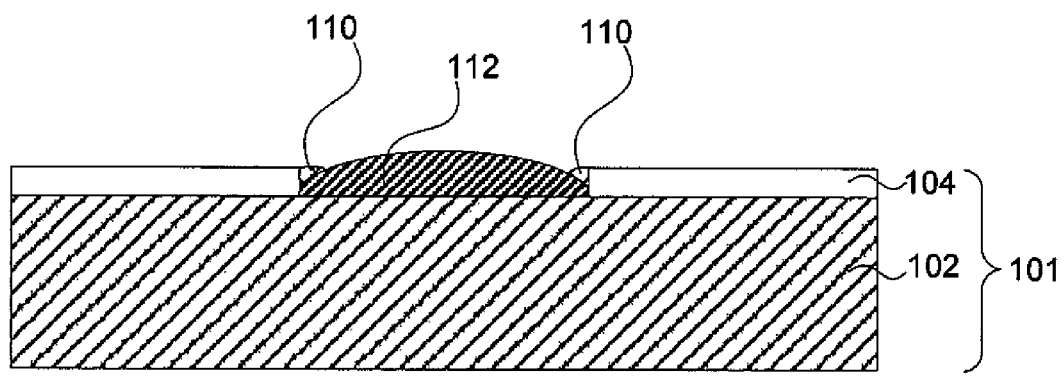
FIGS. 2A and 2B are side cross-section and top views, respectively, of an attachment material layer on a surface, in accordance with one embodiment.
Figure 2B:
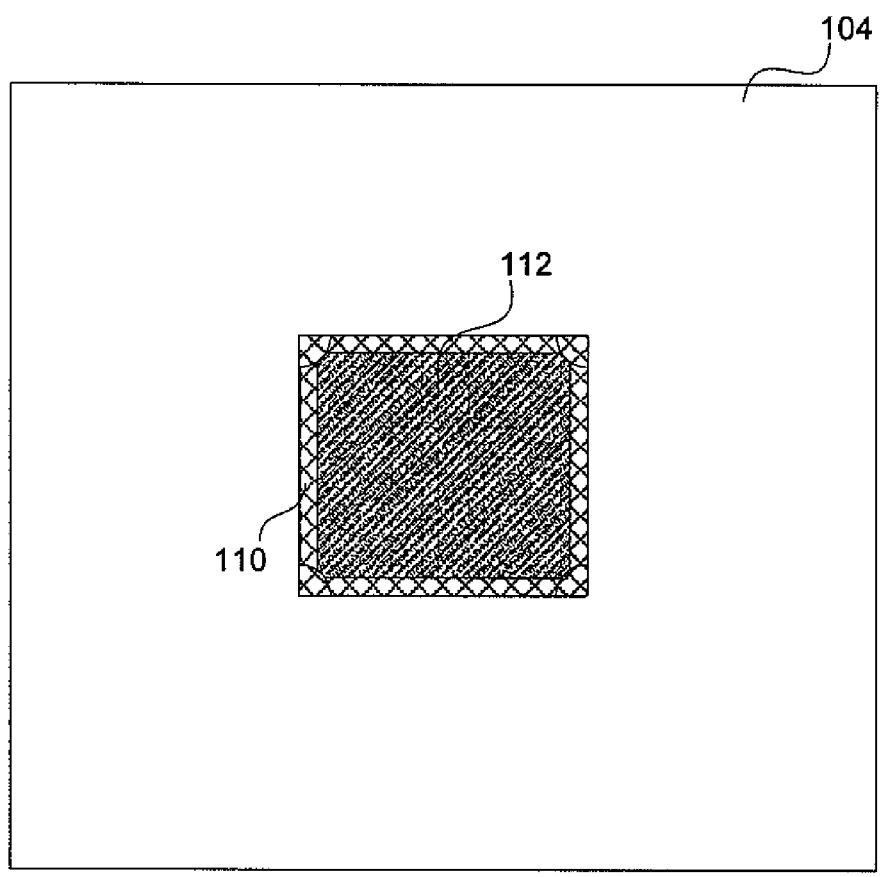

The method can include reflowing the solder so as to distribute the solder over the exposed surface of substrate core 102 so as to form a solder layer which may serve as the attachment material layer 112, as illustrated in side cross-section of FIG. 2A and top view FIG. 2B. The surface can comprises a solderable portion and a non-solderable portion, and the solder can be constrained to the solderable portion of the surface. Flux residue 110 may be present at the boundaries and/or corners of the solderable region.

The method can include providing a component 116 that is to be attached to the attachment surface. The component 116 can comprise an optoelectronic, electronic, photonic, RF, and/or MEMs component. In some embodiments, component 116 can comprise a semiconductor die (e.g., a semiconductor optoelectronic die, semiconductor electronic die, semiconductor photonic die, semiconductor RF die, and/or semiconductor MEMs die). In some embodiments, component 116 may include one or more light-emitting dies, such as LEDs or laser diodes.

Component 116 may include a backside surface. In some embodiments, the backside surface of component 116 may include one or more solderable areas. In some embodiments, substantially all of the backside surface of component 116 can a single unified solderable surface. In other embodiments, the backside surface of component 116 can include separate solderable surfaces which may be electrically separated (e.g., by electrically insulating material, such as a suitable dielectric), as discussed further below. In some embodiments, component 116 can comprise one or more light-emitting die comprising a light emission surface and a backside surface disposed opposite the light emission surface. The light emission surface(s) can thus be disposed opposite the backside surface of component 116. In some embodiments, component 116 comprises substantially only the light-emitting die and thus the backside surface of the light emitting die can be the backside surface of component 116.

Figure 3A:
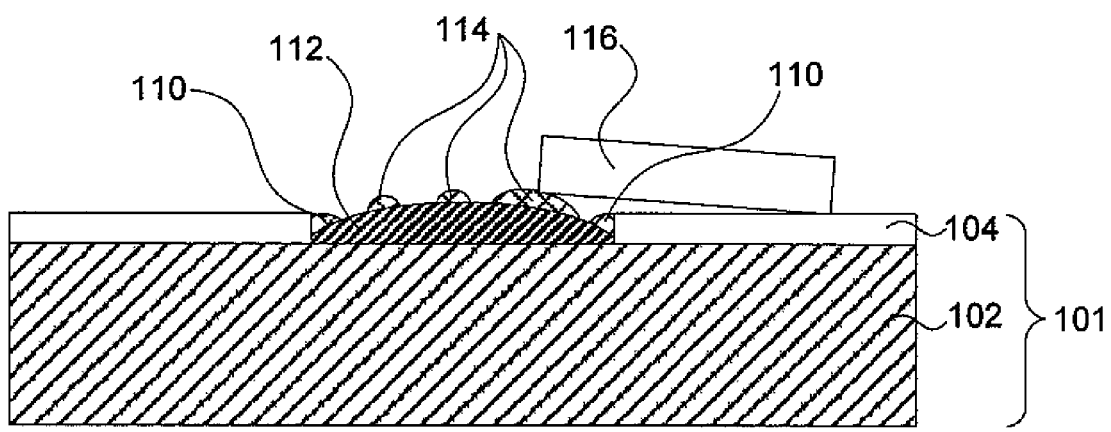
FIGS. 3A and 3B are side cross-section and top views, respectively, of a component disposed over a portion of an attachment material layer, in accordance with one embodiment.
Figure 3B:
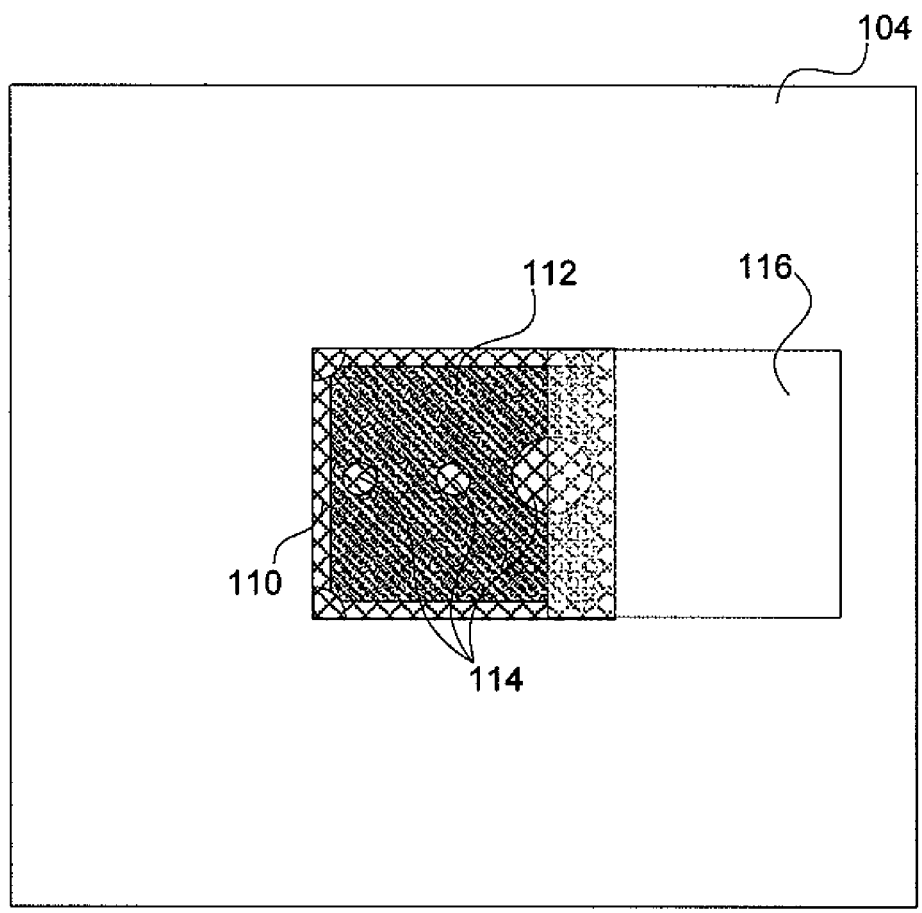
Figure 3C:
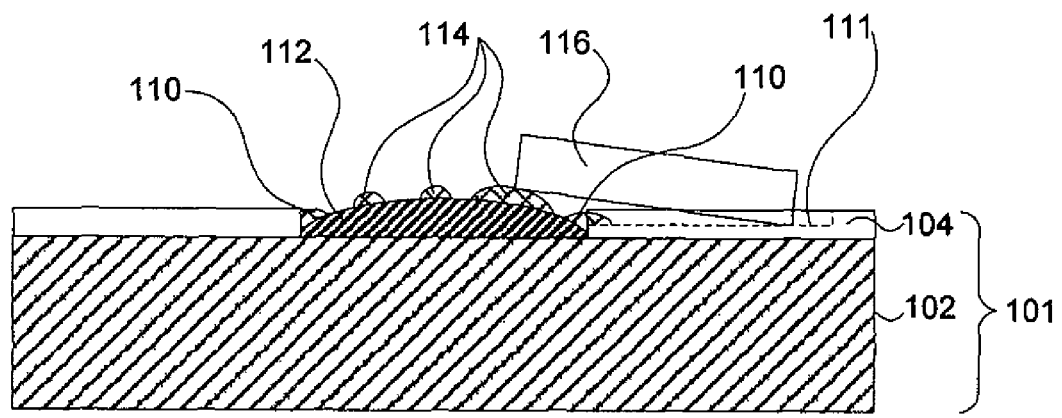
FIGS. 3C and 3D are side cross-section and top views, respectively, of a substrate that includes a component staging area, in accordance with one embodiment.
Figure 3D:
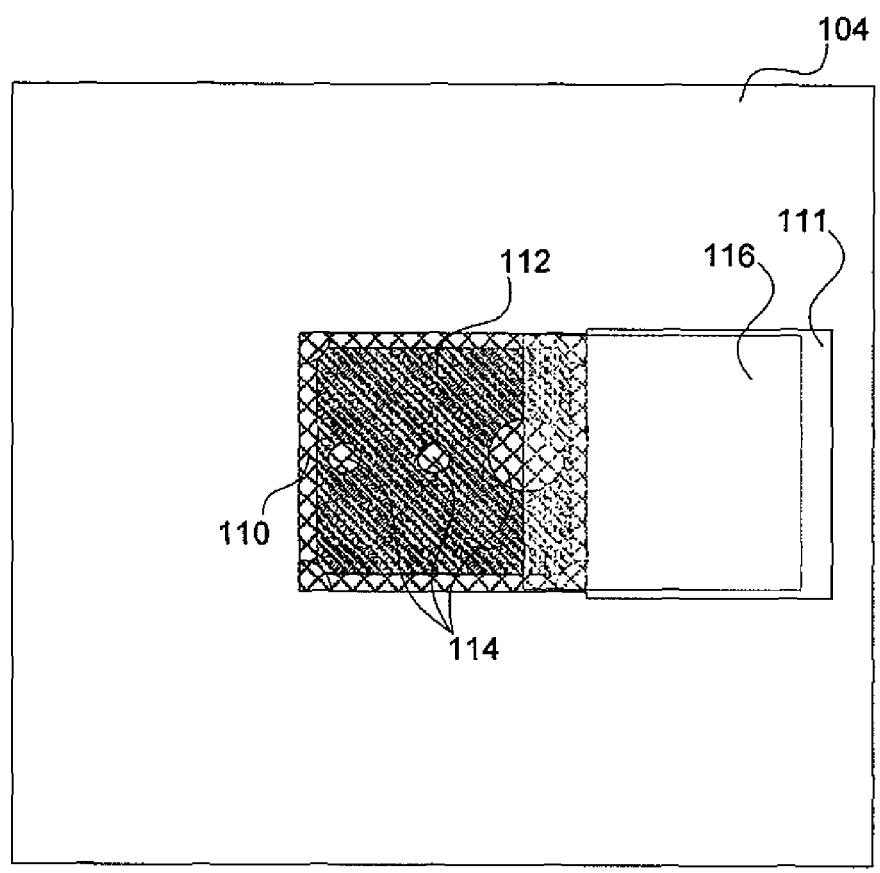

Flux material 114 may be disposed on a solder layer which may serve as the attachment material layer 112. The flux material 114 may be provided onto the solder layer in one or more portions. For example, FIGS. 3A-B illustrate an embodiment where flux 114 is provided in three portions, however any number of flux portions may be used. The portion of flux 114 over which a component 116 can be placed may have the largest volume of the multiple portions. The flux volume under the component can wick and clean the backside of component, thus a larger flux amount can be dispensed under the component to accomplish this. Smaller flux amounts can be dispensed in other regions to clean the solder at the leading edge of component.

The method can include disposing a portion of the backside surface of the component 116 over a first portion of the attachment material layer 112 (e.g., solder layer) such that a substantial portion of the backside surface of the component is not disposed over the attachment material layer, as shown in side cross-section of FIG. 3A and top view FIG. 3B. Flux material 114 may be disposed between the backside surface of the component 116 and the attachment material layer 112 (e.g., solder layer). In some embodiments, less that about 30% (e.g., less than about 20%, less than about 10%) of the backside surface of the component 116 is disposed over the attachment material layer. In some embodiments, a substantial portion (e.g., greater than about 70%, greater than about 80%, greater than about 90%) of the backside surface of the component 116 that is not disposed over the attachment material layer 112 (e.g., solder layer) can be disposed over a non-solderable portion of the surface (e.g., overlayer 104).

In some embodiments, substrate 101 may include a component staging area 111. The component staging area 111 may be a region of the substrate over which component 116 may be partially and/or completely disposed over at the commencement of the attachment process. In some embodiments, component staging area 111 may comprise a non-solderable surface. Component staging area 111 may be disposed adjacent the component attachment area. In the examples shown in side cross-section and top views of FIGS. 3C and 3D, respectively, the component staging area 111 comprises a recessed portion of overlayer 104 located adjacent to the component attachment area that can include attachment material layer 112.

A method of attaching component 116 using a component staging area 111 can include providing a surface comprising an attachment area that can include a solderable surface and a recessed staging area disposed adjacent to the attachment area. The method can include disposing a solder layer over the attachment area, and further disposing a component comprising a backside surface that is substantially disposed over the recessed staging area. The method can include moving the component such that the component is substantially disposed over the attachment area. Such a method can enable the fabrication of a light-emitting device comprising a substrate comprising an attachment area with a solderable surface. A recessed staging area can be located adjacent to the attachment area. The device can include a light-emitting die comprising a light emission surface and a backside surface disposed opposite the light emission surface, wherein the light-emitting die is supported by the substrate. A solder layer can be disposed between the backside surface of the light-emitting die and the solderable surface of the substrate. The solder layer can have low voiding which may be formed as a result of the attachment methods presented herein.

Figure 4A:
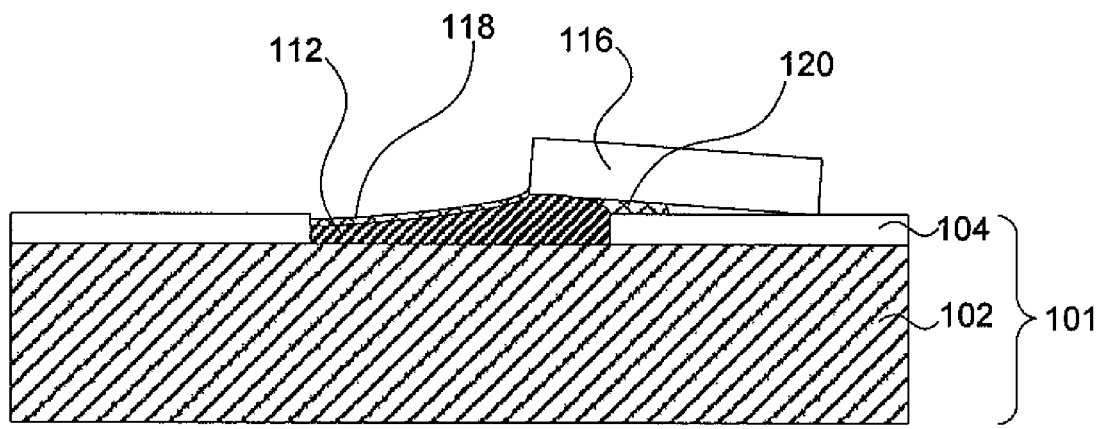
FIGS. 4A and 4B are side cross-section and top views, respectively, of the initiation of attachment material wetting of the backside of a component, in accordance with one embodiment.
Figure 4B:
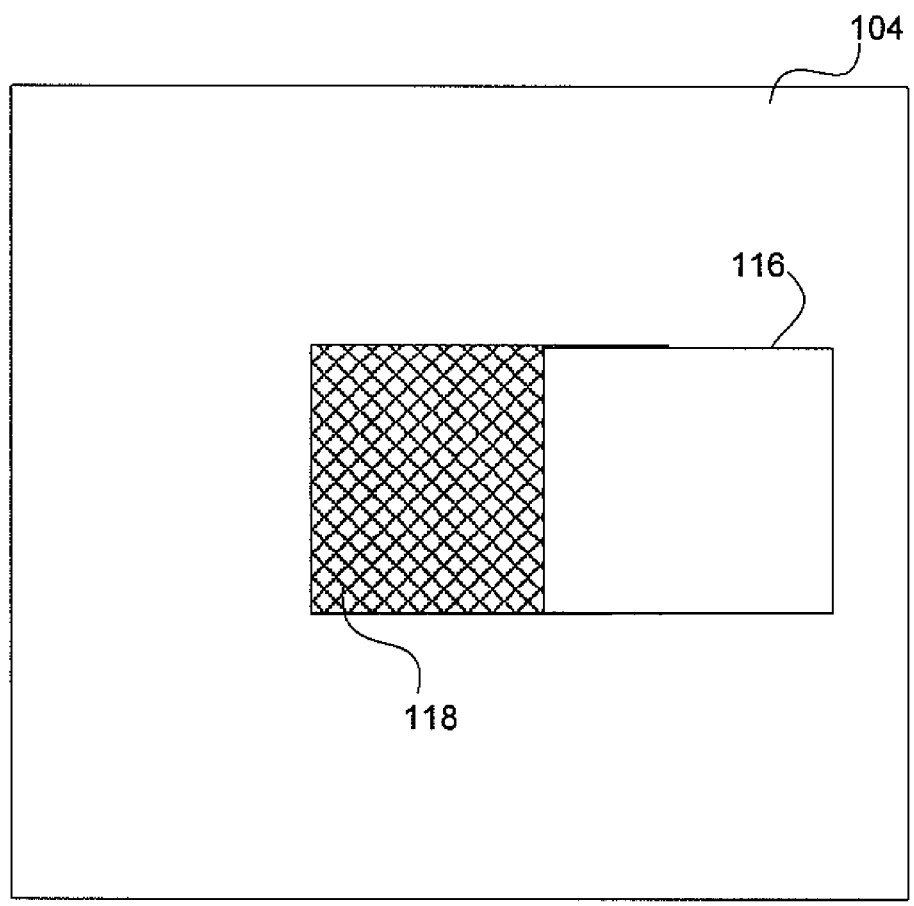
Figure 12A:
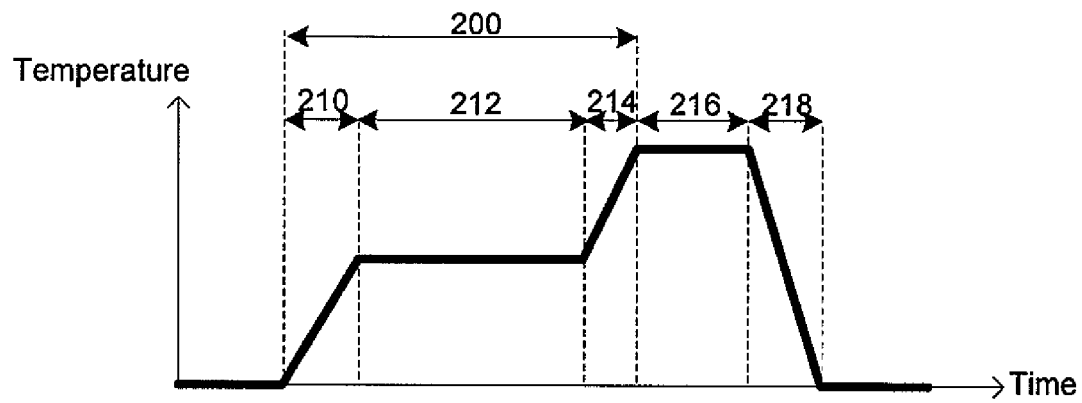
FIGS. 12A-B are temperature-time profiles for attachment material reflow processes, in accordance with one embodiment.

The side cross-section view of FIG. 4A and top view of FIG. 4B illustrate the initiation of attachment material wetting of the backside of component 116. Wetting may occur during a reflow process of the attachment material. During reflow, the attachment material may be elevated to a sufficient temperature to cause the attachment material layer (e.g., solder layer) to flow (e.g., attain a liquid state). Examples of temperature-time profiles that may be applied during a reflow process are presented in FIGS. 12A-B, however it should be appreciated that other temperature-time profiles may be used. The reflow process may also cause flux 118 to spread across the entire surface of attachment material layer and react with the surface of layer thereby removing any oxides present on the surface of attachment layer (e.g., solder layer). Some flux 120 may be expelled from the attachment material layer surface and may accumulate between the backside of component 116 and overlayer 104, as shown in FIG. 12A.

Figure 5A:
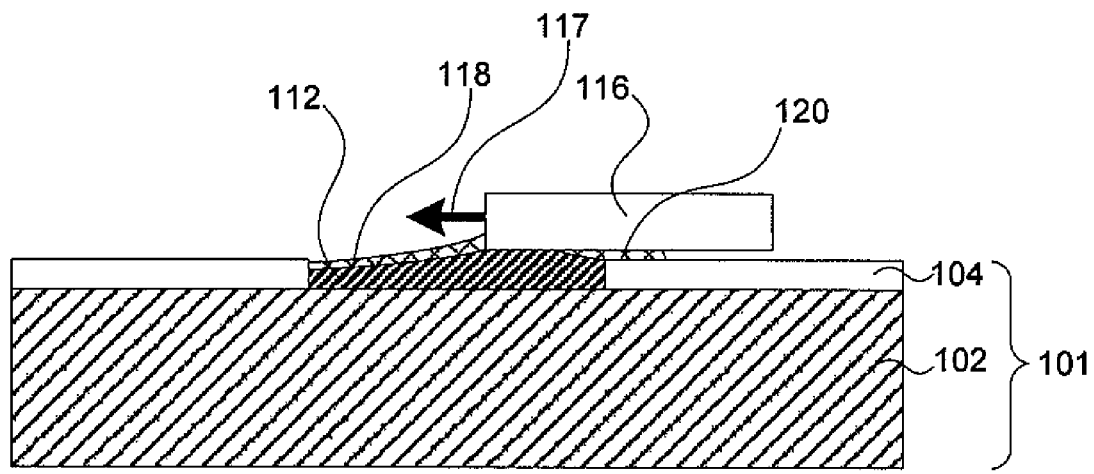
FIGS. 5A and 5B are side cross-section and top views, respectively, of the motion a component such that the component is attached to a portion of an attachment material layer greater than a first portion, in accordance with one embodiment.
Figure 5B:
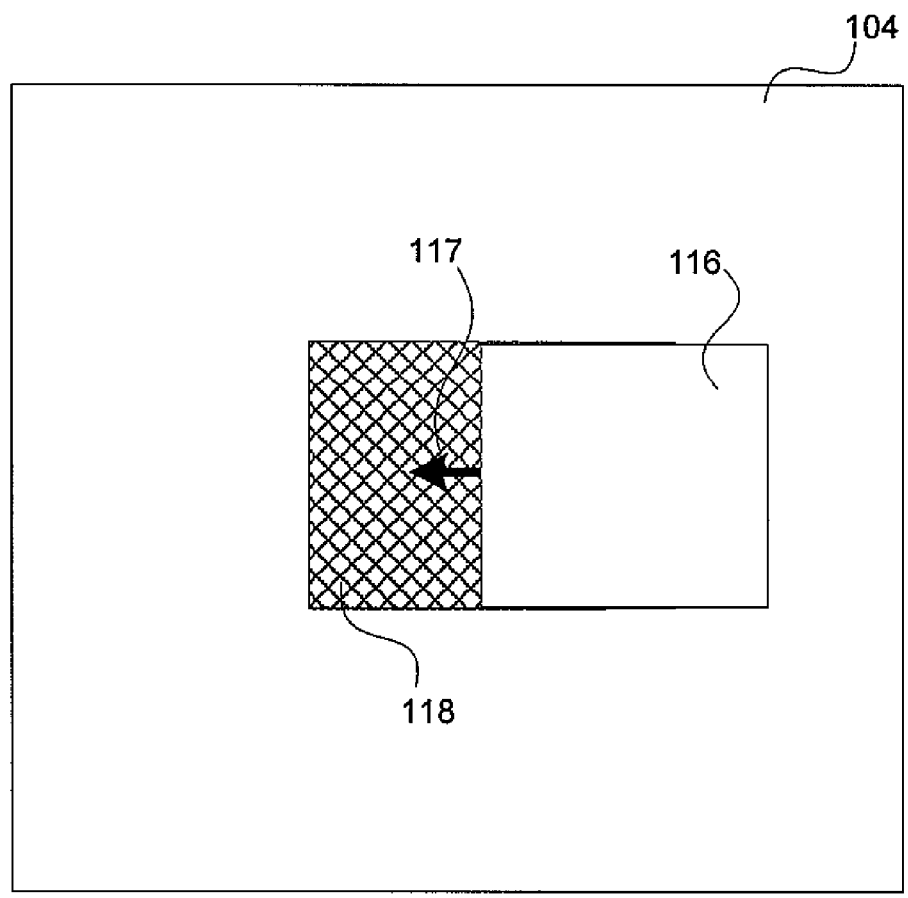

The method can include the movement of component 116 such that the component is attached to at least a portion of the attachment material layer 112 (e.g., solder layer) that is substantially larger than a first portion of the attachment material layer over which the component 116 was disposed over, as shown in side cross-section of FIG. 5A and top view FIG. 5B. The motion of the component 116 can include a lateral movement (as illustrated by arrow 117) such that component 116 moves laterally from a location disposed substantially or completely over the overlayer 104 to a location disposed substantially (e.g., partially or completely) over the attachment material layer.

Movement of component 116 can be achieved via force(s) internal and/or external to the combined system of component 116, attachment material layer 112, and substrate 101. In some embodiments, moving the component 116 comprises moving the component at least partially due to a surface tension force of the attachment material layer 112 (e.g., solder layer). In some embodiments, the movement of component 116 can be substantially all due to surface tension from attachment material layer 112 (e.g., solder layer). In some embodiments, moving the component 116 comprises heating the attachment material layer 112 (e.g., solder layer) which can cause reflow of the attachment material. In some embodiments, heating the attachment material layer 112 (e.g., solder layer) comprises increasing the temperature of the attachment material (e.g., solder) from less than or equal to an activation temperature of the flux material to at least a reflow temperature of the attachment material 112 (e.g., solder) within less than one minute (e.g., less than about 45 seconds, less than about 30 seconds) or such time that would allow solder to reflow during the activation of the flux or before burn-off of the flux.

Alternatively, or additionally, an external force can at least partially or completely cause movement (e.g., lateral movement) of component 116 relative to the attachment substrate. An external force may be applied via a component attach apparatus, and may be completely and/or partially automated. In one embodiment, a component attach apparatus includes a component holder that can be configured to manipulate a component that is to be attached to a surface (e.g., a substrate such as a circuit board or package substrate). The component holder can comprise a pickup tool that can utilize vacuum suction or any other suitable mechanism to pickup and/or hold the component. The component holder can be controlled (e.g., by a control unit that can receive and use data from a vision recognition system) to place the component offset laterally from the attachment material layer. In some embodiments, the component holder can be controlled (e.g., by a control unit) to move the component downwards so as to be in contact with a portion of the attachment material layer. Alternatively, the component holder can be controlled (e.g., by a control unit) to move the component downwards so as to be located laterally offset to the attachment material layer and not in contact with the attachment material layer. The component holder can be controlled (e.g., by a control unit) to laterally move the component while the component backside is in contact with the attachment material layer. The final placement of the component can be such that substantially all of the component backside is disposed over, and in contact with, the attachment material layer. Such a process can lead to low attachment material voiding (e.g., less than about 5% voiding, less than about 1% voiding) under the component backside. In some embodiments, the component attach apparatus can provide for reproducible low voiding of attachment material (e.g., solder) used to attach components to surfaces.

Figure 14:
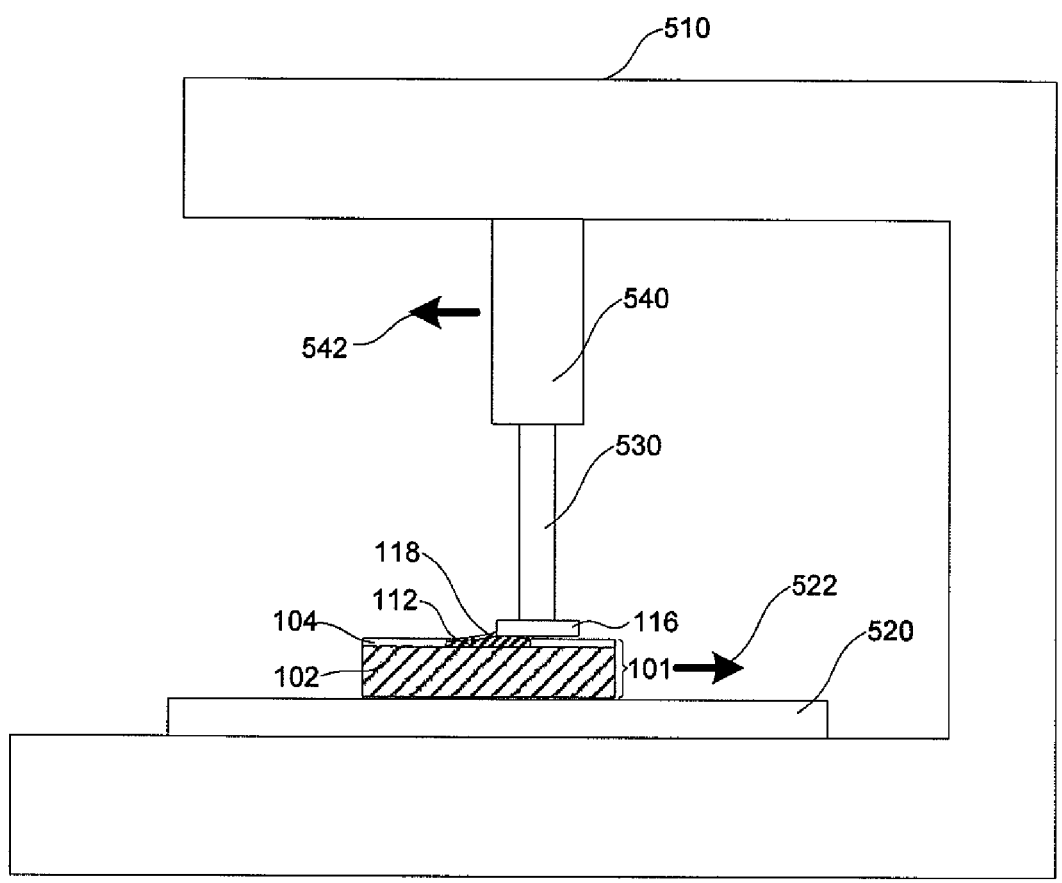
FIG. 14 is a side-view schematic of a component attach apparatus, in accordance with one embodiment.

FIG. 14 illustrates a side-view schematic of a component attach apparatus that can perform one or more of the operations described herein. The component attach apparatus can consistently provide for low void attachment (e.g., less than about 5% voiding, less than about 1% voiding) of components.

The component attach apparatus 510 can comprise a substrate holder 520. The substrate holder 520 can be configured to hold a substrate 101 to which a component 116 can be attached. The component attach apparatus 510 can comprise a component holder 530. The component holder 530 can be configured to hold the component 116 to be attached to the substrate 101. The component attach apparatus 510 can comprise a positioning tool 540 which can move the component holder 530 and hence the component 116. The component attach apparatus 510 can be configured such that the component 116 can be moved (e.g., via the motion of the component holder 530) and/or the surface to which component will be attached (e.g., substrate) can be moved (e.g., via the motion of the substrate holder 520). Either one or both of such motions, as illustrated by arrows 542 and 522, can be utilized to provide the lateral movement of the component relative the attachment surface.

Figure 6A:
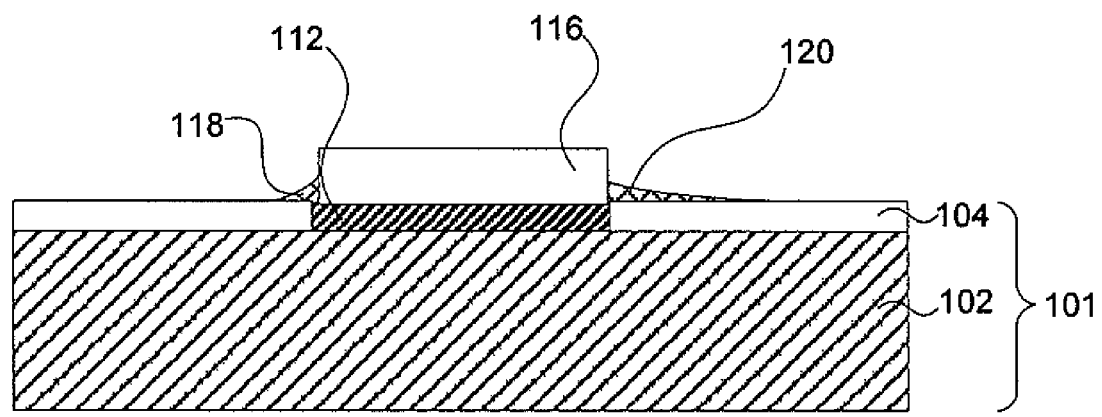
FIGS. 6A and 6B are side cross-section and top views, respectively, of a component attached to substantially all of an attachment material layer, in accordance with one embodiment.
Figure 6B:
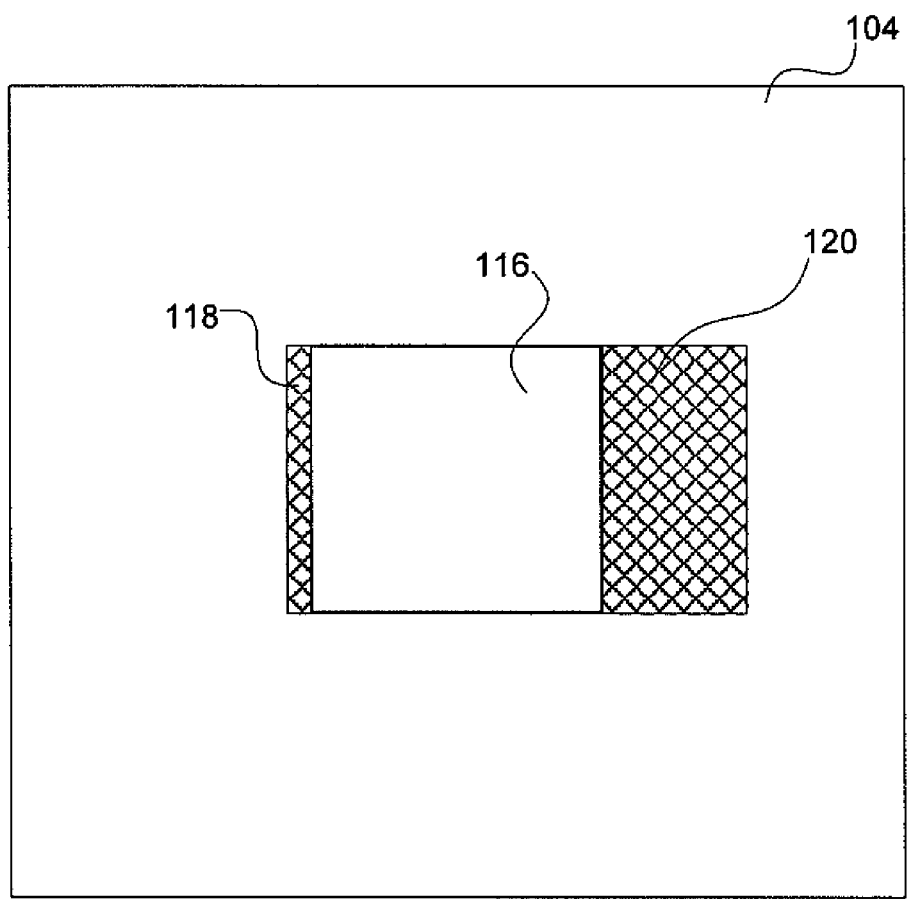

As shown in side cross-section of FIG. 6A and top view of FIG. 6B, upon completing the movement of the component 1116, the component 116 may be attached to substantially all of the attachment material layer 112 (e.g., solder layer). A trail of flux 120 may form due to expulsion from the backside of the component 116. Also, a pile-up of flux 118 may form due to a pile-up effect caused by the motion of the component 116. In some embodiments, flux 118 and/or 120 may be removed. Flux removal can include aqueous cleaning, plasma cleaning and/or other cleaning methods used in the manufacture of printed circuit boards or packaged semiconductor chips. The motion of component 116 may result in low voiding of the attachment material layer 112 (e.g., solder layer).

In some embodiments, after moving the component such that the component is attached to the at least a portion of the attachment material layer 112 (e.g., solder layer), the attachment material layer 112 (e.g., solder layer) has voiding of less than 5% of an area of the backside surface of component 116. In some embodiments, the attachment material layer 112 (e.g., solder layer) has voiding of less than 1% of an area of the backside surface of component 116.

In some embodiments, component 116 may comprises a light-emitting die having a large light emission surface area (e.g., greater than about 1 $mm^2$, greater than about 3 $mm^2$, greater than about 5 $mm^2$, greater than about 10 $mm^2$). Light may be extracted substantially all via a top emission surface with an insignificant portion of light emitted via the edges of the large-area light-emitting die. As described further below, such a quality may be due to the presence of light extraction features on the surface of the light-emitting die. The light extraction features may include a patterned and/or roughened surface.

The component attach methods provided herein can enable the formation of a light-emitting device that can operate under high currents (e.g., greater than about 3 Amps, greater than about 5 Amps, greater than about 10 Amps) which can be facilitated by a low thermal resistance of the low void attachment material layer. The low voiding of the attachment material layer can facilitate heat conduction to the attachment substrate. The light-emitting device can comprise a component including a light-emitting die, wherein the light-emitting die is supported by a substrate. The light-emitting die can comprise a light emission surface and a backside surface disposed opposite the light emission surface, and wherein the light emission surface of the light-emitting die has an area greater than or equal to about 1 $mm^2$ (e.g., greater than about 3 mm, greater than about 5 mm, greater than about 10 $mm^2$). An attachment material layer can be disposed between the backside surface of the light-emitting die and the substrate. The attachment material layer can have voiding of less than 5% of an area of the backside surface of the light-emitting die. In some embodiments, voiding is less than about 1% of the area of the backside surface of the light-emitting die. In some embodiments, the attachment material comprises solder.

Figure 7A:
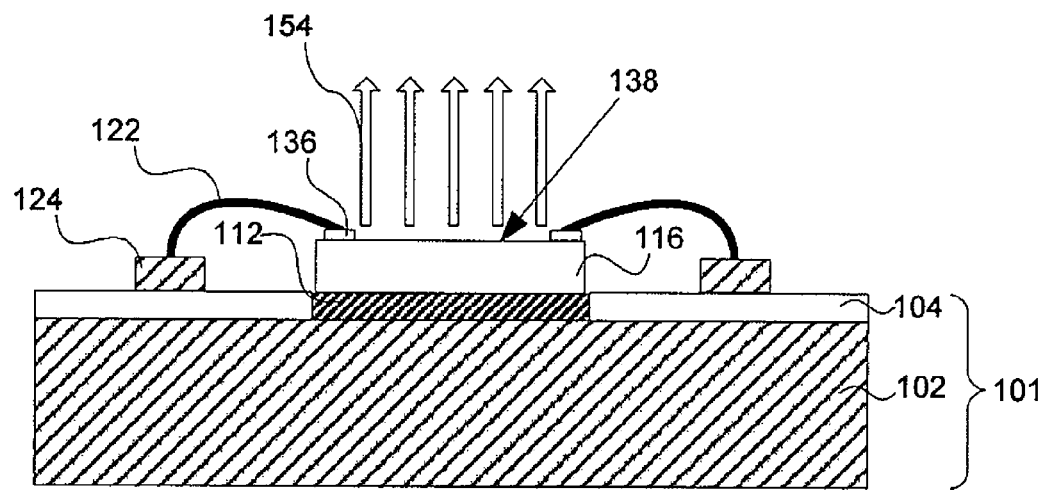
FIGS. 7A and 7B are side cross-section and top views, respectively, of an attached component that includes a light-emitting die, in accordance with one embodiment.
Figure 7B:
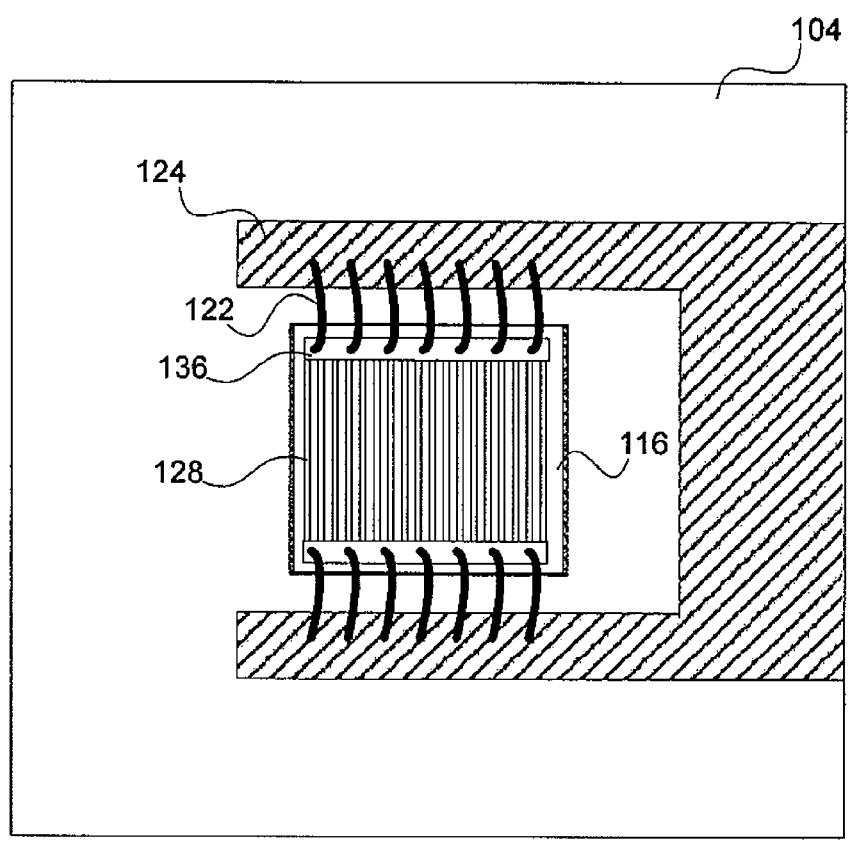

FIGS. 7A and 7B illustrate side cross-section and top views, respectively, of an attached component 116 that includes a light-emitting die. A light emission surface 138 of the light-emitting die may be arranged opposite the backside of the light-emitting die that may be attached via attachment material layer 112. Such a configuration allows for light 154 to be emitted from the light-emission surface which can have a large area (e.g., greater than about 1 mm$^2$, greater than about 3 mm$^2$, greater than about 5 mm$^2$, greater than about 10 mm$^2$). Large electrical currents can be provided to the light-emitting die so as to generate large amounts of light since heat generated during operation of the light-emitting die may be efficiently conducted via a low resistance (e.g., low voiding) attachment material layer 112. In some embodiments, substantially all of the light generated within the light-emitting die is extracted via a top surface (e.g., light emission surface 138) and not the sidewalls of the light-emitting die. This may be accomplished by providing light extraction features on the light emission surface 138 of the light-emitting die. In some embodiments, light extraction features can comprise a patterned surface and/or a roughened surface, as described in further detail below.

The light-emitting die of component 116 can include top contact bond pads 136 (e.g., metal contact bond pads). Electrical current may be spread over the top surface of the light-emitting die via current spreading layer(s) and/or structures, such as a conductive transparent layer (e.g., conductive oxide such as indium tin oxide) and/or electrically conductive fingers 128 (e.g., metal fingers). One or more electrically conductive traces 124 (e.g., metal traces) may be disposed over the overlayer 104. Wire bonds 122 can provide for electrical connection between contact bond pads 136 and electrically conductive traces 124. Backside electrical contact of the light-emitting die can be achieved via substrate core 102 and attachment material layer 112 when the substrate core and the attachment material are electrically conductive, for example, when the attachment material comprises a metal solder.

Figure 8:
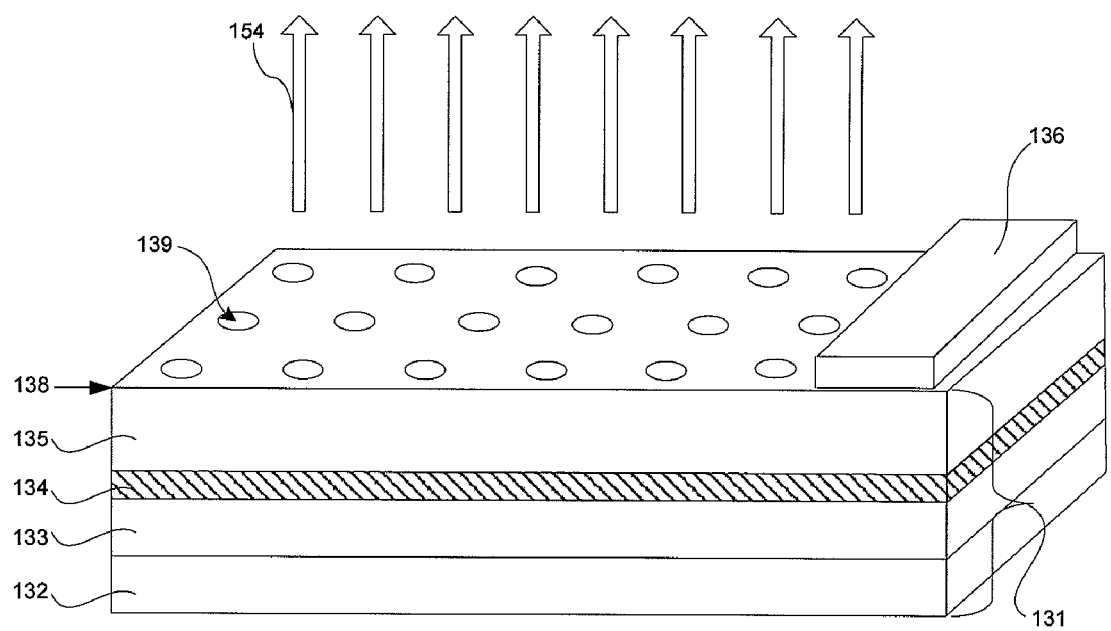
FIG. 8 is a view of a light-emitting die, in accordance with one embodiment.

FIG. 8 illustrates a light-emitting die that can include a light-emitting diode (LED) that may be used in connection with the embodiments described above. It should be understood that various embodiments presented herein can also be applied to other light-emitting dies, such as laser diode dies, and LED dies having different structures (such as organic LEDs, also referred to as OLEDs). The LED die shown in FIG. 8 comprises a multi-layer stack 131 that may be disposed on a support structure (not shown), such as a submount (e.g., a metal submount). The multi-layer stack 131 can include an active region 134 which can be formed between n-doped layer(s) 135 and p-doped layer(s) 133. The stack can also include an electrically conductive layer 132 which may serve as a p-side contact and/or as an optically reflective layer. An n-side contact pad 136 may be disposed on layer 135. Electrically conductive fingers (not shown) and/or a current spreading layer (e.g., transparent conductive layer, such as a transparent conductive oxide) may extend from the contact pad 136 and along light emission surface 138, thereby allowing for uniform current injection into the LED structure.

It should be appreciated that the LED is not limited to the configuration shown in FIG. 8, for example, the n-doped and p-doped sides may be interchanged so as to form a LED having a p-doped region in contact with contact pad 136 and an n-doped region in contact with layer 132. As described further below, electrical potential may be applied to the contact pads which can result in light generation within active region 134 and emission (represented by arrows 154) of at least some of the light generated through light emission surface 138. As described further below, holes 139 may be defined in an emission surface to form a pattern that can influence light emission characteristics, such as light extraction and/or light collimation. It should be understood that other modifications can be made to the representative LED structure presented, and that embodiments are not limited in this respect.

The active region of an LED can include one or more quantum wells surrounded by barrier layers. The quantum well structure may be defined by a semiconductor material layer (e.g., in a single quantum well), or more than one semiconductor material layers (e.g., in multiple quantum wells), with a smaller electronic band gap as compared to the barrier layers. Suitable semiconductor material layers for the quantum well structures can include InGaN, AlGaN, GaN and combinations of these layers (e.g., alternating InGaN/GaN layers, where a GaN layer serves as a barrier layer). In general, LEDs can include an active region comprising one or more semiconductors materials, including III-V semiconductors (e.g., GaAs, AlGaAs, AlGaP, GaP, GaAsP, InGaAs, InAs, InP, GaN, InGaN, InGaAlP, AlGaN, as well as combinations and alloys thereof), II-VI semiconductors (e.g., ZnSe, CdSe, ZnCdSe, ZnTe, ZnTeSe, ZnS, ZnSSe, as well as combinations and alloys thereof), and/or other semiconductors. Other light-emitting materials are possible such as quantum dots or organic light-emission layers.

The n-doped layer(s) 135 can include a silicon-doped GaN layer (e.g., having a thickness of about 4000 nm thick) and/or the p-doped layer(s) 133 can include a magnesium-doped GaN layer (e.g., having a thickness of about 40 nm thick). The electrically conductive layer 132 may be a reflective layer, such as a silver-containing layer (e.g., having a thickness of about 100 nm), which may reflects upwards any downward propagating light generated by the active region 134. Furthermore, although not shown, other layers may also be included in the LED; for example, an AlGaN layer may be disposed between the active region 134 and the p-doped layer(s) 133. It should be understood that compositions other than those described herein may also be suitable for the layers of the LED.

As a result of holes 139, the LED can have a dielectric function that varies spatially according to a pattern. Typical hole sizes can be less than about one micron (e.g., less than about 750 nm, less than about 500 nm, less than about 250 nm) and typical nearest neighbor distances between holes can be less than about one micron (e.g., less than about 750 nm, less than about 500 nm, less than about 250 nm). Furthermore, as illustrated in the figure, the holes 139 can be non-concentric.

The dielectric function that varies spatially according to a pattern can influence the extraction efficiency and/or collimation of light emitted by the LED. In some embodiments, a layer of the LED may have a dielectric function that varies spatially according to a pattern. In the illustrative LED die of FIG. 8, the pattern is formed of holes, but it should be appreciated that the variation of the dielectric function at an interface need not necessarily result from holes. Any suitable way of producing a variation in dielectric function according to a pattern may be used. The pattern may be periodic (e.g., having a simple repeat cell, or having a complex repeat supercell), or non-periodic. As referred to herein, a complex periodic pattern is a pattern that has more than one feature in each unit cell that repeats in a periodic fashion. Examples of complex periodic patterns include honeycomb patterns, honeycomb base patterns, (2×2) base patterns, ring patterns, and Archimedean patterns. In some embodiments, a complex periodic pattern can have certain holes with one diameter and other holes with a smaller diameter. As referred to herein, a non-periodic pattern is a pattern that has no translational symmetry over a unit cell that has a length that is at least 50 times the peak wavelength of light generated by one or more light-generating portions. As used herein, peak wavelength refers to the wavelength having a maximum light intensity, for example, as measured using a spectroradiometer. Examples of non-periodic patterns include aperiodic patterns, quasi-crystalline patterns (e.g., quasi-crystal patterns having 8-fold symmetry), Robinson patterns, and Amman patterns. A non-periodic pattern can also include a detuned pattern (as described in U.S. Pat. No. 6,831,302 by Erchak, et al., which is incorporated herein by reference in its entirety). In some embodiments, the LED may include a roughened surface.

In certain embodiments, an interface of a light-emitting device is patterned with holes which can form a photonic lattice. Suitable LEDs having a dielectric function that varies spatially (e.g., a photonic lattice) have been described in, for example, U.S. Pat. No. 6,831,302 B2, entitled "Light emitting devices with improved extraction efficiency," filed on Nov. 26, 2003, which is herein incorporated by reference in its entirety. A high extraction efficiency for an LED implies a high power of the emitted light and hence high brightness which may be desirable in various optical systems.

Light may be generated by the LED as follows. The p-side contact layer can be held at a positive potential relative to the n-side contact pad, which causes electrical current to be injected into the LED. As the electrical current passes through the active region, electrons from n-doped layer(s) can combine in the active region with holes from p-doped layer(s), which can cause the active region to generate light. The active region can contain a multitude of point dipole radiation sources that generate light with a spectrum of wavelengths characteristic of the material from which the active region is formed. For InGaN/GaN quantum wells, the spectrum of wavelengths of light generated by the light-generating region can have a peak wavelength of about 445 nanometers (nm) and a full width at half maximum (FWHM) of about 30 nm, which is perceived by human eyes as blue light. The light emitted by the LED may be influenced by any patterned surface through which light passes, whereby the pattern can be arranged so as to influence light extraction and/or collimation.

In other embodiments, the active region can generate light having a peak wavelength corresponding to ultraviolet light (e.g., having a peak wavelength of about 370-390 nm), violet light (e.g., having a peak wavelength of about 390-430 nm), blue light (e.g., having a peak wavelength of about 430-480 nm), cyan light (e.g., having a peak wavelength of about 480-500 nm), green light (e.g., having a peak wavelength of about 500 to 550 nm), yellow-green (e.g., having a peak wavelength of about 550-575 nm), yellow light (e.g., having a peak wavelength of about 575-595 nm), amber light (e.g., having a peak wavelength of about 595-605 nm), orange light (e.g., having a peak wavelength of about 605-620 nm), red light (e.g., having a peak wavelength of about 620-700 nm), and/or infrared light (e.g., having a peak wavelength of about 700-1200 nm).

In certain embodiments, the LED may emit light having a high light output power. As previously described, the high power of emitted light may be a result of a pattern that influences the light extraction efficiency of the LED. For example, the light emitted by the LED may have a total power greater than 0.5 Watts (e.g., greater than 1 Watt, greater than 5 Watts, or greater than 10 Watts). In some embodiments, the light generated has a total power of less than 100 Watts, though this should not be construed as a limitation of all embodiments. The total power of the light emitted from an LED can be measured by using an integrating sphere equipped with spectrometer, for example a SLM12 from Sphere Optics Lab Systems. The desired power depends, in part, on the optical system that the LED is being utilized within.

The light generated by the LED may also have a high total power flux. As used herein, the term "total power flux" refers to the total optical power divided by the light emission area. In some embodiments, the total power flux is greater than 0.03 Watts/mm, greater than 0.05 Watts/mm, greater than 0.1 Watts/mm$^2$, or greater than 0.2 Watts/mm$^2$. However, it should be understood that the LEDs used in systems and methods presented herein are not limited to the above-described power and power flux values.

In some embodiments, the LED may be associated with one or more wavelength converting regions. The wavelength converting region(s) may include one or more phosphors and/or quantum dots. The wavelength converting region(s) can absorb light emitted by the light-generating region of the LED and emit light having a different wavelength than that absorbed. In this manner, LEDs can emit light of wavelength (s) (and, thus, color) that may not be readily obtainable from LEDs that do not include wavelength converting regions. In some embodiments, one or more wavelength converting regions may be disposed over (e.g., directly on) the emission surface (e.g., surface 38) of the light-emitting device.

Figure 9A:
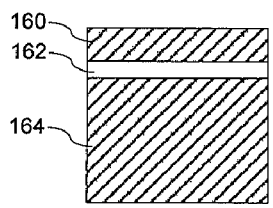
FIG. 9A is a backside view of a component, in accordance with one embodiment.
Figure 9B:
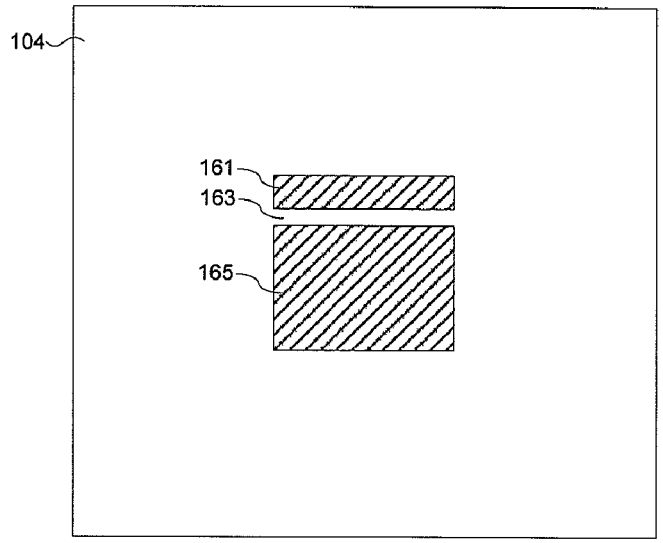
FIG. 9B is a top view of a surface to which the component of FIG. 9A can be attached, in accordance with one embodiment.
Figure 9C:
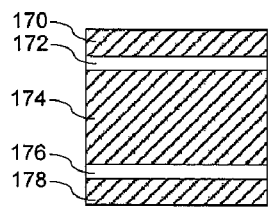
FIG. 9C is a backside view of a component, in accordance with one embodiment.
Figure 9D:
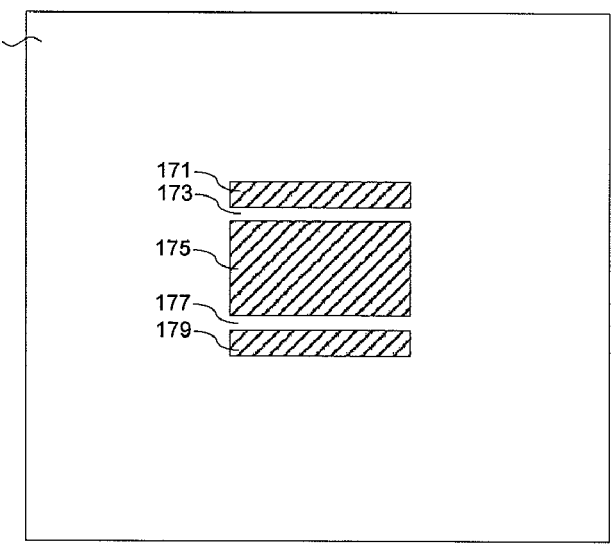
FIG. 9D is a top view of a surface to which the component of FIG. 9A can be attached, in accordance with one embodiment.

FIGS. 9A and 9C illustrate different backside configurations for component 116 which can include two or more separate attachment regions (e.g., solderable regions). FIGS. 9B and 9D illustrate different configurations for surfaces to which components, having backsides illustrated in FIGS. 9A and 9C, respectively, can be attached to. A plurality of electrical contact regions may be used to provide same-side electrical contacts to a light-emitting die (e.g., a light-emitting die that is part or all of component 116). The plurality of electrical contact regions may be solderable regions. Such a configuration can allow for a wire-bond-free structure.

FIG. 9A illustrates a backside configuration for a component having a first electrical contact 160, a second electrical contact 164, and a region 162 that separates the two electrical contacts 160 and 164. Region 162 may comprise a material that is electrically insulating, such as a polymer (e.g., an electrically non-conductive epoxy) or ceramic. In some embodiments, region 162 may comprise a material that is substantially thermally conductive. Contacts 160 and 164 may comprise a material that is electrically conductive, for example, one or more metals. Contacts 160 and 164 may have solderable surfaces. In some embodiments, region 162 may be non-solderable.

FIG. 9B illustrates a top view of a surface to which a component may be attached. The surface may comprise a first attachment region 161 (e.g., first solderable region) and a second attachment region 165 (e.g., second solderable region 165), which may be separated by a region 163 which may be non-solderable. In some embodiments, region 163 may be part of overlayer 104. The component illustrated in FIG. 9A may be attached to the surface of FIG. 9B such that contact 160 is disposed over region 161 and contact 164 is disposed over region 165. A solder material layer may be disposed between the areas and can provided for an electrically conductive connection.

A method of attaching the component of FIG. 9A to the surface of FIG. 91B can involve a lateral movement (e.g., during attachment material reflow) such that contacts 160 and 161, and regions 164 and 165, are substantially aligned during the attach process. Such a process can be similar to that already described in connection with FIGS. 1-6.

FIG. 9C illustrates a backside of a component having three contact regions 170, 174, and 178, which may be separated by regions 172 and 176 which may be non-solderable. FIG. 9D illustrates a top view of a surface to which a component may be attached. The surface may comprise a first attachment region 171 (e.g., first solderable region), a second attachment region 175 (e.g., second solderable region), and a third attachment region 179 (e.g., third solderable region), which may be separated by regions 173 and 177, which may be non-solderable. In some embodiments, regions 173 and 177 can be part of overlayer 104. The component illustrated in FIG. 9C may be attached to the surface of FIG. 9D such that contact 170 is disposed over region 171, contact 174 is disposed over region 175, and contact 178 is disposed over region 179. A solder material layer may be disposed between the areas and can be provided for an electrically conductive connection.

It should be appreciated that any number of attachment regions (e.g., solderable regions) on the backside of component 116 are possible. The attachment regions (e.g., solderable regions) on the backside of component 116 can serve as p-contacts and n-contacts to a light-emitting die. In some embodiments, multiple p-contact and n-contact attachment regions (e.g., solderable regions) may be on the backside of component 116.

Figure 10A:
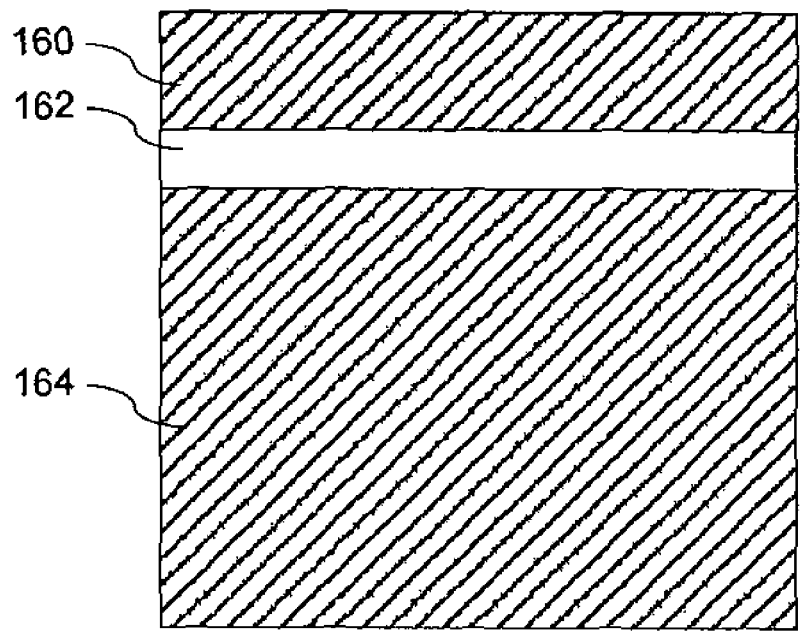
FIGS. 10A and 10B are side cross-section and top views, respectively, of a light-emitting die having a plurality of backside contacts, in accordance with one embodiment.
Figure 10B:
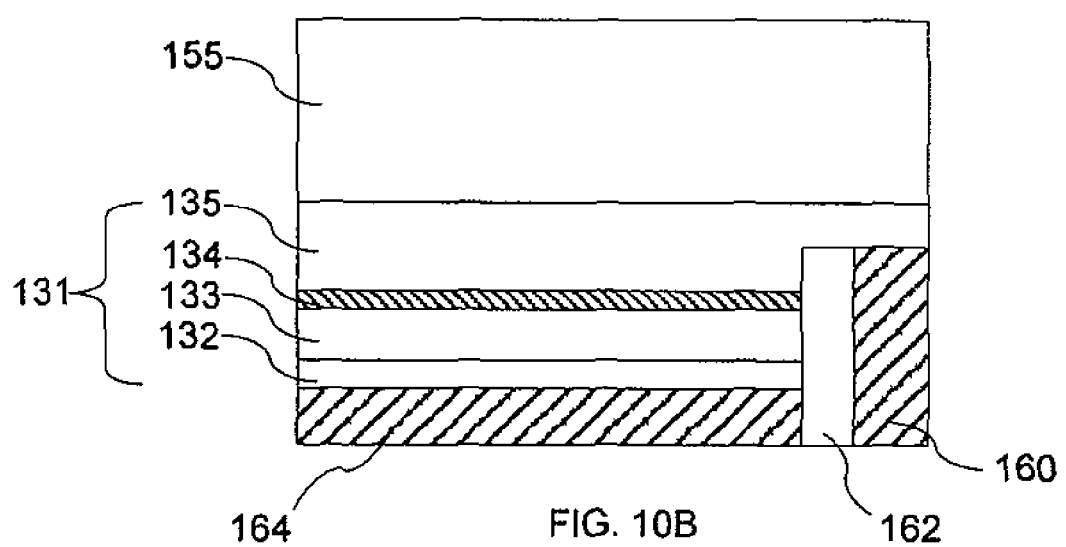

FIGS. 10A and 10B illustrate a bottom view and a cross-section view of a light-emitting die that can have a plurality of backside contacts. The backside contacts may serve as attachment regions (e.g., solderable regions). For example, contacts 160 and 164 can serve as same-side electrical contacts for the light-emitting die. Cross-section view of FIG. 10B illustrates an example of a light-emitting die that can enable a plurality of backside contacts that can enable same-side electrical contacting. The light-emitting die can comprise a multi-layer stack 131, as previously described in relation to FIG. 8. The light-emitting may be a flip-chip light-emitting die that can be surface mounted onto an attachment surface.

Electrical contact 164 (e.g., metal contact layer) can provide for electrical contact to layer 133 of the multi-layer stack 131. Electrical contact 160 (e.g., metal contact layer) can provide for electrical contact to layer 135 of the multi-layer stack 131. Region 162 may comprise an electrically insulating material (e.g., a dielectric such as an oxide) which can electrically isolate electrical contacts 160 and 164. A substrate 155 may serve as an epitaxial template on which semiconductor layers 135, 134, and 132 may have been deposited. For example, substrate 155 may be sapphire substrate on which a GaN-based multi-layer structure is epitaxially deposited, as is known by those of skill in the art. After growth of the layers 135, 134, and 132, other portions of the structure can be formed via known semiconductor fabrication processes.

Figure 11A:
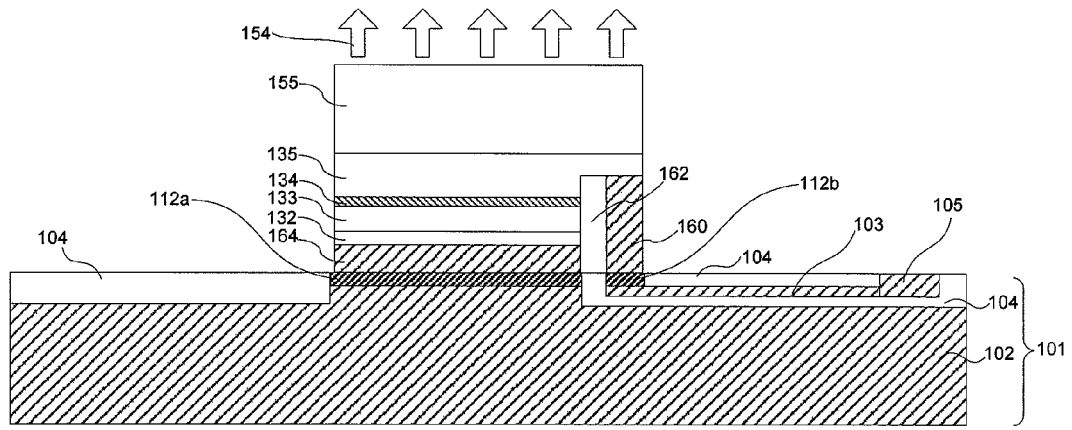
FIGS. 11A-C are side cross-section views of light-emitting dies having a plurality of backside contacts attached to a surface, in accordance with one embodiment.
Figure 11B:
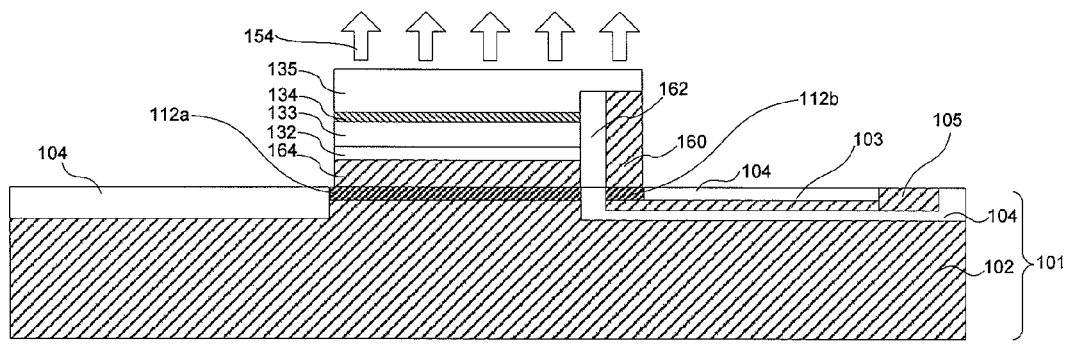
Figure 11C:
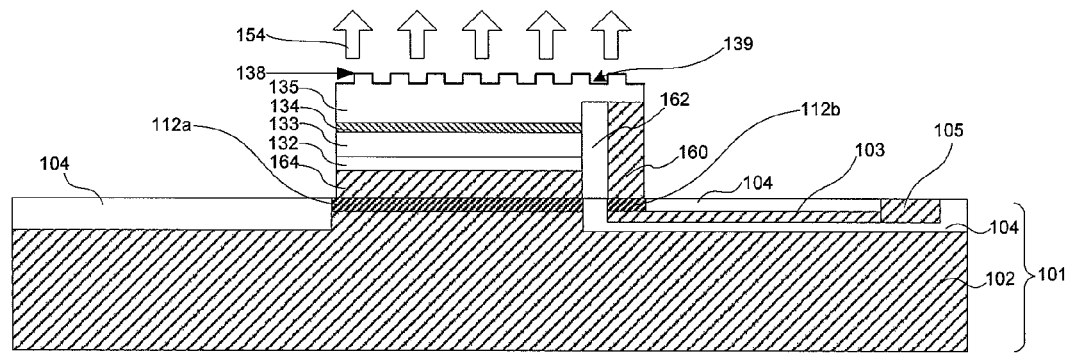

FIGS. 11A-C illustrate embodiments whereby a light-emitting die having a plurality of backside contacts can be attached to a surface. The light-emitting die can be the die illustrated in FIGS. 10A-B, or other light-emitting dies or components.

FIG. 11A illustrates a light-emitting die attached to a substrate 101 having a plurality of separate attachment material layers 112a and 112b. In some embodiments, attachment material layers 112a and/or 112b may comprise electrically conductive materials, for example a solder (e.g., a metal solder). Electrical contact 164 of the light-emitting die shown in FIGS. 10A-B may be attached to the substrate core 102 via attachment material layer 112a. Electrical contact 160 of the light-emitting die shown in FIGS. 10A-B may be attached to an electrically conductive trace layer 103 (e.g., metal trace) via attachment material layer 112a. An electrically conductive pad 105 may be used for external electrical contact, for example via an electrical connector. In some embodiments, substrate core 102 is electrically conductive and thus can allow for electrical contact to contact 164 via attachment material layer 112a. In some embodiments where substrate 155 is transparent (e.g., as is the case for a sapphire substrate), substrate 155 may be kept and light 154 generated within the light-emitting die can be transmitted through the substrate 155 and emerge via the top surface of the substrate 155, as illustrated in FIG. 11A.

FIG. 11B illustrates a light-emitting die attached to a substrate 101 wherein substrate 155 has been removed. In some embodiments, substrate 155 may be removed after attachment of the light-emitting die to substrate 101. Substrate 155 may be removed using one or more techniques, including but not limited to laser liftoff, grinding, lapping, substrate etching, etch liftoff, and/or ion-cut (e.g., Smart-cut™). Laser liftoff processes are disclosed, for example, in U.S. Pat. Nos. 6,420,242 and 6,071,795, which are hereby incorporated by reference in their entirety. Etch liftoff processes may involve the use of a buried etch layer that is selectively etched laterally so as to result in removal of the substrate. Ion-cut processes can involve the use of ion implantation to form a weakened area at which splitting can be induced.

FIG. 11C illustrates a light-emitting die attached to a substrate 101 wherein the light emission surface 138 includes light extraction features. In some embodiments, the light extraction features include a roughened surface and/or a patterned surface (e.g., having holes 139), as previously described herein. The light extraction features can be configured to enable substantially all (e.g., at least about 70%, at least about 80%, at least about 90%) of the emitted light to be emitted via the light emission surface 138 rather than the sidewalls of the light-emitting die. This is particularly beneficial for large light-emitting dies, for example dies having an area greater than about 1 mm$^2$ as little light remains trapped within the light-emitting die due to total internal reflection.

Figure 12B:
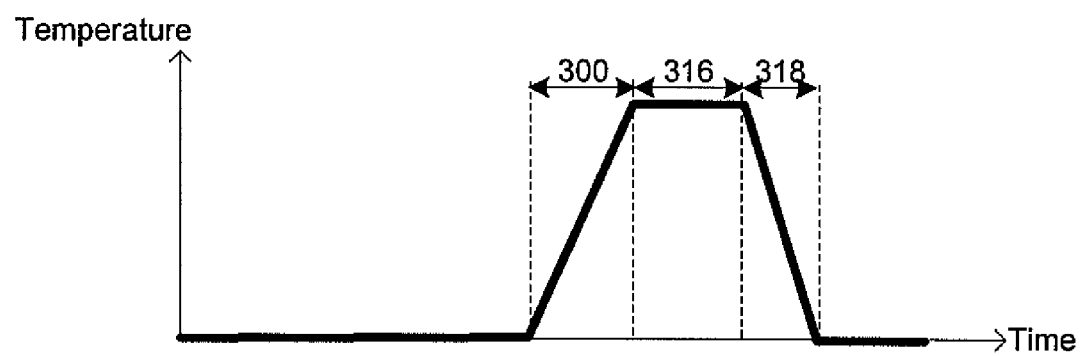

FIGS. 12A-B illustrate temperature-time profiles for attachment material reflow processes. In some embodiments, the attachment material can include a solder. The reflow process can enable simultaneous solder reflow and flux activation. The process may be used as an attachment material reflow procedure for the methods illustrated in connection with FIGS. 1-6. The reflow process can be used to enable low-voiding of an attachment material layer. The method of attaching a component can comprise providing a solder layer over a solderable surface, providing a flux material layer in contact with the solder layer, reflowing the solder layer such that a substantial activity of the flux material layer is attained during the reflow of the solder layer, and attaching a component to a solderable surface with the solder layer.

FIG. 12A illustrates a temperature-time profile for a conventional solder reflow procedure. Conventional solder reflow procedures employ a long preheat process to facilitate burn-off of solvents within the flux and a slow temperature ramp to avoid thermal shock in the component. Such conventional reflow procedures involve a time period 200 during which the temperature is ramped from an initial temperature (e.g., room temperature) up to a solder reflow temperature. Time period 200 includes a first temperature ramp period 210, a preheat soak period 212, and a second temperature ramp period 214. The temperature during the preheat soak period typically is within a range of about 160 degrees Celsius to about 190 degrees Celsius, for typical fluxes (e.g., water soluble fluxes such as TACflux-025 made by Indium Corp., no-clean fluxes such as TACflux-023 made by Indium Corp. or Kester-951 made by Kester Corp.). Conventional wisdom is that the preheat soak period provides for the activation of the flux and the burn-off of any solvents in the flux. Time period 200 typically ranges from about 2 minutes to about 3 minutes. During a solder reflow period 216, the solder flows due to an elevated temperature. The solder reflow temperature is about 220 degrees Celsius for typical surface mount solders (e.g., $SnAg_{3.0}Cu_{0.5}$). After reflow, the temperature is ramped down during a temperature ramp-down period 218.

The inventor has appreciated that long preheat procedures leave behind flux solids with reduced activity, which can contribute to void formation within the solder layer. The inventor has realized that short temperature ramp-up times can significantly reduce attachment layer voiding. The inventor also appreciated that simultaneous solder reflow and flux activation can contribute to low voiding within the solder layer. FIG. 12B illustrates a temperature-time profile of a reflow process that can enable low voiding for a solder layer. The process may include a temperature ramp-up period 300, a solder reflow period 316 where the solder is at a temperature greater than or equal to the solder reflow temperature (e.g., about 220 degrees Celsius for $SnAg_{3.0}Cu_{0.5}$) and a temperature ramp-down period 318. In some embodiment, the ramp-up period takes less than about 1 minute. In other embodiments, the ramp-up period takes less than about 45 seconds. In yet other embodiments, the ramp-up period takes less than about 30 seconds. In some such processes, the solder can reflow when the flux attains peak flux activity.

WORKING EXAMPLE

Figure 13:
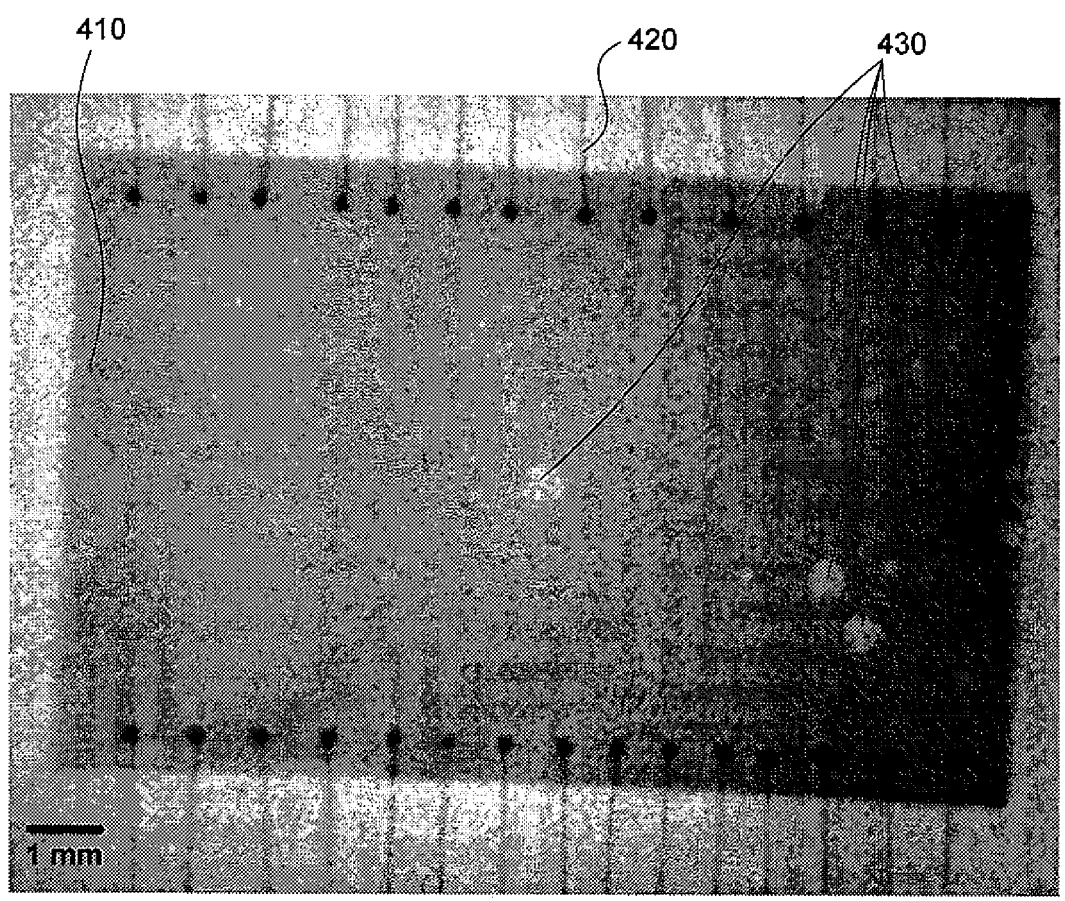
FIG. 13 is an x-ray image of a light-emitting die solder-attached to a metal substrate, in accordance with one embodiment.

The following results are illustrative and should not be construed as limiting the scope of the present invention. FIG. 13 illustrates an x-ray image of a light-emitting die solder-attached to a metal substrate using the attachment methods described herein. The light-emitting die in this working example comprised a GaN-based semiconductor LED die supported on a copper-tungsten submount. The surface of the LED was patterned so as to enhance light-extraction via the surface of the LED. The die area was about 120 $mm^2$. The attachment material was a preformed solder $SnAg_{3.0}Cu_{0.5}$ having dimensions similar to the die backside and the flux utilized was TACflux-023. The die backside surface comprised copper tungsten submount with about 0.5 microns of titanium chromium and a surface layer of about 1 micron of gold. The substrate was a gold-plated copper core board, with an exposed die attachment area having about the same dimensions as the die.

Die attachment was performed by dispensing flux on the die attachment area of the core board. Preformed solder was placed over the flux. A reflow process was performed to activate the flux and reflow the preformed solder, as was described in relation to FIG. 12B. This process created a layer of solder on the core board. Flux was then dispensed on the solder layer, as was described in FIG. 3. The light-emitting die was then placed offset the solder layer, as was described in FIG. 3. A reflow process was again performed as described in relation to FIG. 12B. The reflow allowed the solder to wet the backside of the light-emitting die, as was described in FIG. 4. This wetting caused the die to be pulled towards the remainder of the solder layer not under the die and ultimately position the light-emitting die within the confines of the die attachment area, as was described in FIGS. 5 and 6. Wire-bonding to contact pads on the surface of the die was then performed to create an operational LED.

The image shown in FIG. 13 was obtained using a CRX 2000 X-ray system. In the image shown, 410 is the light-emitting die as viewed from the top and 420 are wire-bonds to the top-surface of the light-emitting die. The image shows solder voids 430 which are calculated to cover less than about 1% of the backside area of the light-emitting die. Such low attachment material voiding for such large area light-emitting dies (e.g., large surface light emission dies) greatly facilitates thermal management.

As used herein, when a structure (e.g., layer, region) is referred to as being "on", "over" "overlying" or "supported by" another structure, it can be directly on the structure, or an intervening structure (e.g., layer, region) also may be present. A structure that is "directly on" or "in contact with" another structure means that no intervening structure is present.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of attaching a component, the method comprising:
   disposing an attachment material layer over a surface;
   providing the component having a backside surface;
   disposing a portion of the backside surface of the component over a first portion of the attachment material layer such that a substantial portion of the backside surface of the component is not disposed over the attachment material layer; and
   moving the component relative the surface such that the component is attached to at least a portion of the attachment material layer that is substantially larger than the first portion of the attachment material layer.

2. The method of claim 1, wherein the attachment material comprises a solder.

3. The method of claim 2, wherein the surface comprises a solderable portion and a non-solderable portion, and wherein the solder is constrained to the solderable portion of the surface.

4. The method of claim 3, wherein the substantial portion of the backside surface of the component that is not disposed over the attachment material layer is disposed over the non-solderable portion of the surface.

5. The method of claim 2, further comprising disposing flux material between the solder and the backside surface of the component.

6. The method of claim 5, wherein moving the component comprises heating the solder.

7. The method of claim 6, wherein heating the solder comprises increasing the temperature of the solder from less than or equal to an activation temperature of the flux material to at least a reflow temperature of the solder within less than one minute.

8. The method of claim 2, wherein disposing an attachment material layer over the surface comprises disposing a pre-formed solder over the surface.

9. The method of claim 8, wherein the preformed solder has a substantially similar area as the component.

10. The method of claim 2, wherein disposing an attachment material layer over the surface comprises disposing a solder paste over the surface.

11. The method of claim 2, wherein after moving the component such that the component is attached to the at least a portion of the solder layer, the solder layer has voiding of less than 5% of an area of the backside surface of the component.

12. The method of claim 2, wherein after moving the component such that the component is attached to the at least a portion of the solder layer, the solder layer has voiding of less than 1% of an area of the backside surface of the component.

13. The method of claim 1, wherein moving the component such that the component is attached to at least a portion of the attachment material layer that is substantially larger than the first portion of the attachment material layer comprises moving the component such that the component is attached to substantially all of the attachment material layer.

14. The method of claim 1, wherein moving the component comprises moving the die at least partially due to a surface tension force of the attachment material layer.

15. The method of claim 1, wherein moving the component comprises moving the die at least partially due to an external force.

16. The method of claim 1, wherein the component comprises a light-emitting die.

17. The method of claim 16, wherein the light-emitting die has a light emission surface area greater than 1 $mm^2$.

18. The method of claim 16, wherein the light-emitting die has a light emission surface area greater than 3 $mm^2$.

19. The method of claim 16, wherein the light-emitting die has a light emission surface area greater than 10 $mm^2$.

* * * * *

UNITED STATES PATENT AND TRADEMARK OFFICE
CERTIFICATE OF CORRECTION

PATENT NO. : 7,993,940 B2  Page 1 of 1
APPLICATION NO. : 11/950934
DATED : August 9, 2011
INVENTOR(S) : Warren P. Pumyea It is certified that error appears in the above-identified patent and that said Letters Patent is hereby corrected as shown below:

Column 12, line 60, "Fig. 91B" should be "Fig. 9B".

Signed and Sealed this
Twenty-ninth Day of May, 2012

David J. Kappos
*Director of the United States Patent and Trademark Office*